(12) United States Patent
Chou

(10) Patent No.: US 9,397,624 B2
(45) Date of Patent: Jul. 19, 2016

(54) UNITY GAIN BUFFERS AND RELATED METHOD

(71) Applicant: Taiwan Semiconductor Manufacturing Company, Ltd., Hsin-Chu (TW)

(72) Inventor: Chung-Cheng Chou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/329,866

(22) Filed: Jul. 11, 2014

(65) Prior Publication Data

US 2016/0013756 A1  Jan. 14, 2016

(51) Int. Cl.
*H03F 3/45* (2006.01)
*H03F 1/02* (2006.01)
*H03F 3/50* (2006.01)

(52) U.S. Cl.
CPC ............ *H03F 3/505* (2013.01); *H03F 3/45183* (2013.01); *H03F 2200/135* (2013.01); *H03F 2200/456* (2013.01); *H03F 2200/555* (2013.01); *H03F 2203/45674* (2013.01)

(58) Field of Classification Search
USPC ..................................... 330/252–261
See application file for complete search history.

(56) References Cited

U.S. PATENT DOCUMENTS 7,521,998 B2 *  4/2009  Okayama ...................... 330/257

* cited by examiner

*Primary Examiner* — Hieu Nguyen
(74) *Attorney, Agent, or Firm* — Slater Matsil, LLP

(57) ABSTRACT

A device includes an amplifier stage, a source follower, a resistive device, and a transistor. The source follower has an input terminal electrically coupled to an internal node of the amplifier stage, and an output terminal electrically coupled to an input terminal of the amplifier stage and an output terminal of the device. The resistive device has a first terminal electrically coupled to the output terminal of the device. The transistor is electrically coupled to a second terminal of the resistive device and the amplifier stage.

20 Claims, 4 Drawing Sheets

UNITY GAIN BUFFERS AND RELATED METHOD

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards a sub-20 nanometer node).

Shrinking the semiconductor process node entails reductions in operating voltage and current consumption of electronic circuits developed in the semiconductor process node. For example, operating voltages have dropped from 5V to 3.3V, 2.5V, 1.8V, and even 0.9V. A wave of mobile device popularity has increased pressure in the industry to develop low power circuits that drain miniscule operating current from batteries that power the mobile devices. Lower operating current extends battery life of battery-operated mobile devices, such as smartphones, tablet computers, ultrabooks, and the like.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely pull-up circuits and related methods. Other embodiments may also be applied, however, to other types of pull-up circuits.

Throughout the various figures and discussion, like reference numbers refer to like objects or components. Also, although singular components may be depicted throughout some of the figures, this is for simplicity of illustration and ease of discussion. A person having ordinary skill in the art will readily appreciate that such discussion and depiction can be and usually is applicable for many components within a structure.

In the following disclosure, a novel unity gain buffer circuit and method are introduced. The unity gain buffer circuit uses a source follower circuit to achieve significant area savings while maintaining or improving performance.

Figure 1:
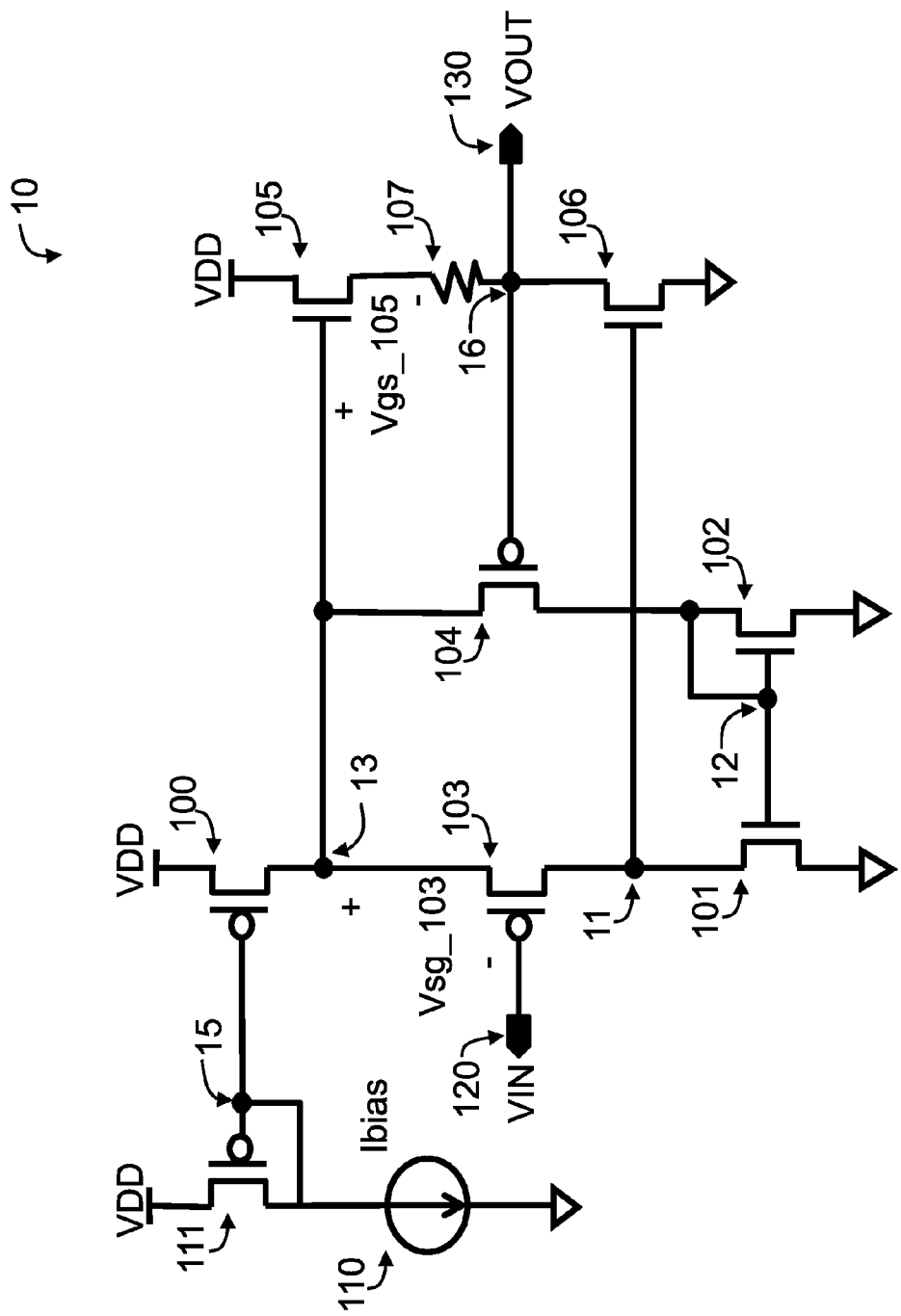
FIG. 1 is a diagram of a device in accordance with one or more embodiments of the present disclosure.

FIG. 1 is a diagram of a device 10 in accordance with one or more embodiments of the present disclosure. A gate electrode of a transistor 103 is electrically coupled to an input terminal 120. In some embodiments, the transistor 103 is a P-type metal-oxide-semiconductor (PMOS) transistor. A gate electrode of a transistor 104 is electrically coupled to an output terminal 130. In some embodiments, the transistor 104 is a PMOS transistor. In some embodiments, the combination of the transistors 103, 104 is a differential pair of the device 10. A source electrode of the transistor 103 is electrically coupled to a source electrode of the transistor 104 (e.g., at a node 13). A source-gate voltage Vsg_103 is a voltage difference between the source electrode of the transistor 103 and the gate electrode of the transistor 103.

A drain electrode of the transistor 103 is electrically coupled to a drain electrode of a transistor 101. In some embodiments, the transistor 101 is an N-type metal-oxide-semiconductor (NMOS) transistor. A gate electrode of the transistor 101 is electrically coupled to a gate electrode of a transistor 102. A drain electrode of the transistor 102 is electrically coupled to the gate electrode of the transistor 102. In some embodiments, the combination of the transistors 101, 102 is an active load of the differential pair (the transistors 103, 104).

A drain electrode of a transistor 100 is electrically coupled to the source electrode of the transistor 103 and the source electrode of the transistor 104. A source electrode of the transistor 100 is electrically coupled to a first voltage source. In some embodiments, the first voltage source is a bandgap voltage reference. The first voltage source provides a first voltage VDD for application to various terminals of the device 10 (e.g., the source electrode of the transistor 100). In some embodiments, the transistor 100 is a PMOS transistor. In some embodiments, the transistor 100 is a tail current source of the differential pair (the transistor 103, 104). In some embodiments, the combination of the transistors 100-104 is an operational amplifier, an operational amplifier first stage, or the like.

In some embodiments, amplitude of current generated by the transistor 100 is based on voltage at a gate electrode of the transistor 100. The gate electrode of the transistor 100 is electrically coupled to a gate electrode of a transistor 111. The gate electrode of the transistor 100 and the gate electrode of the transistor 111 are electrically coupled to a drain electrode of the transistor 111. In some embodiments, the source electrode of the transistor 111 is electrically coupled to the first voltage source. The drain electrode of the transistor 111 is electrically coupled to a reference current source 110. The reference current source 110 provides a substantially fixed electrical current Ibias. The amplitude of the current generated by the transistor 100 is substantially a multiple of the electrical current Ibias. The multiple is primarily based on a ratio of sizes of the transistor 100 and the transistor 111. As a non-limiting example, the transistor 100 optionally has a width of 5 microns and a length of 1 micron, and the transistor 111 optionally has a width of 1 micron and a length of 1 micron. In this non-limiting example, the multiple is 5 ([5/1]/[1/1]), where the size is equal to width divided by length (W/L) of the transistor under consideration.

A gate electrode of a transistor 106 is electrically coupled to the drain electrode of the transistor 101 and the drain electrode of the transistor 103. A drain electrode of the transistor 106 is electrically coupled to the output terminal 130. A source electrode of the transistor 106 is electrically coupled to a second voltage source. In some embodiments, the second voltage source is electrical ground. In some embodiments, the transistor 106 is an NMOS transistor.

A first terminal of a resistive device (or "resistor") 107 is electrically coupled to the output terminal 130. A second terminal of the resistor 107 is electrically coupled to a source electrode of a transistor 105. In some embodiments, the resistor 107 is a polysilicon resistor, or other integrated resistor. A gate electrode of the transistor 105 is electrically coupled to the source electrode of the transistor 103 and the source electrode of the transistor 104. A drain electrode of the transistor 105 is electrically coupled to the first voltage source. A gate-source voltage Vgs_105 is a voltage difference between the gate electrode of the transistor 105 and the source electrode of the transistor 105. In some embodiments, the transistor 105 is an NMOS transistor. In some embodiments, the combination of the transistors 105, 106 and the resistor 107 is a modified source follower circuit.

Gate-aspect ratio of a metal-oxide-semiconductor (MOS) transistor is defined as ratio of transistor width to transistor channel length, or W/L. In some embodiments, gate-aspect ratio of the transistor 105 is greater than gate-aspect ratio of the transistor 103. When the gate-aspect ratio of the transistor 105 is greater than the gate-aspect ratio of the transistor 103, the source-gate voltage Vsg_103 is substantially equal to the sum of the gate-source voltage Vgs_105 and the voltage across the resistor 107 (e.g., $I_{107} \times R_{107}$, where $I_{107}$ is current flowing through the resistor 107, and $R_{107}$ is resistance of the resistor 107), and voltage VOUT at the output terminal 130 is substantially equal to voltage VIN at the input terminal 120. The resistor 107 self-regulates the current $I_{107}$ to satisfy the relationship just described (Vsg_103=Vgs_105+$I_{107}R_{107}$). In some embodiments, the transistor 106 operates in the linear region. In some embodiments, gate-aspect ratio of the transistor 106 is greater than gate-aspect ratio of the transistor 101.

Figure 2:
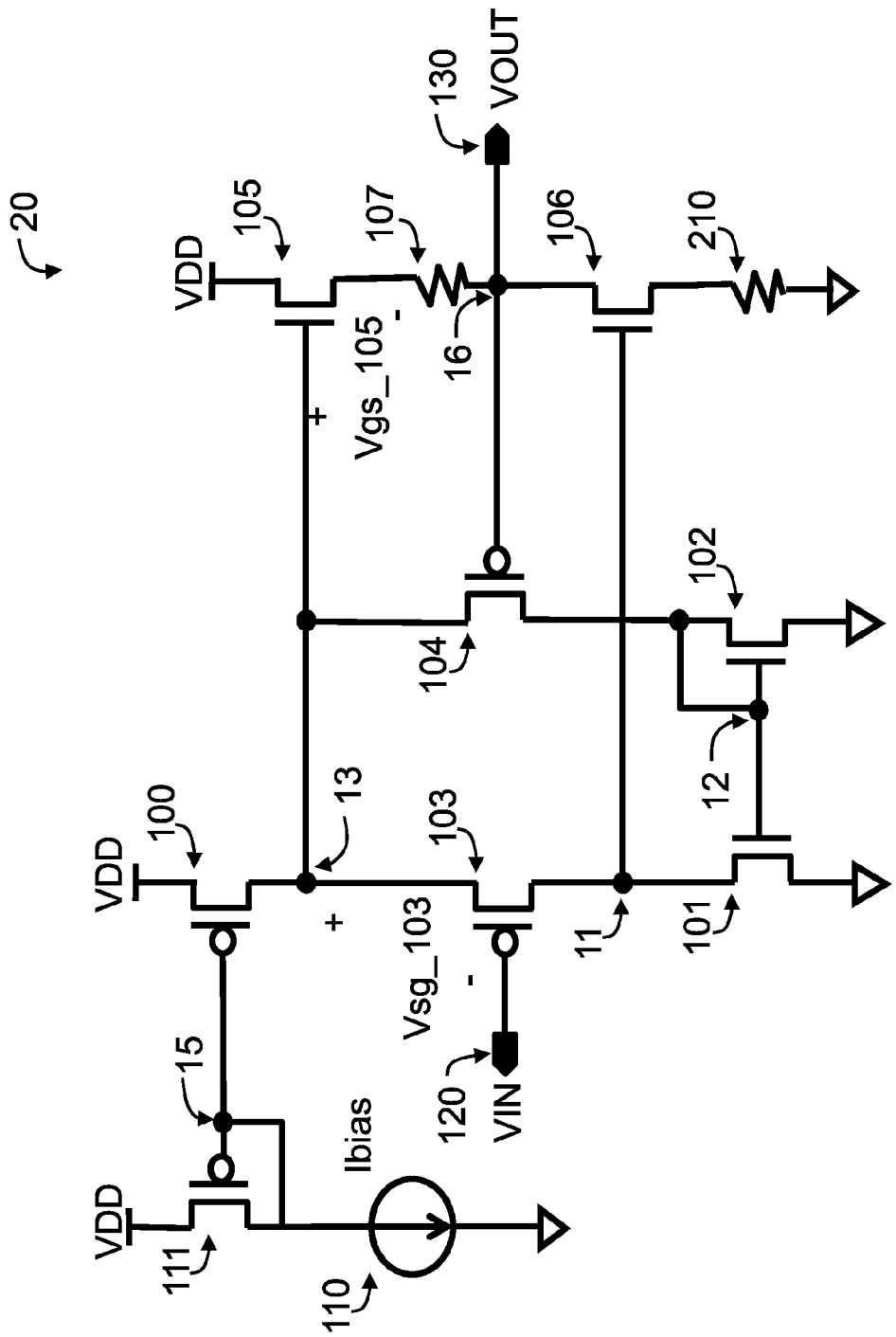
FIG. 2 is a diagram of a device in accordance with one or more embodiments of the present disclosure.

FIG. 2 is a diagram of a device 20 in accordance with one or more embodiments of the present disclosure. The device 20 is similar in many aspects to the device 10, and like reference numerals refer to like elements in FIGS. 1 and 2. As shown in FIG. 2, in some embodiments, the source electrode of the transistor 106 is electrically coupled to the second voltage source (e.g., ground) through a second resistive device (or "second resistor") 210. In some embodiments, the second resistor 210 is a polysilicon resistor, or other integrated resistor.

Figure 3:
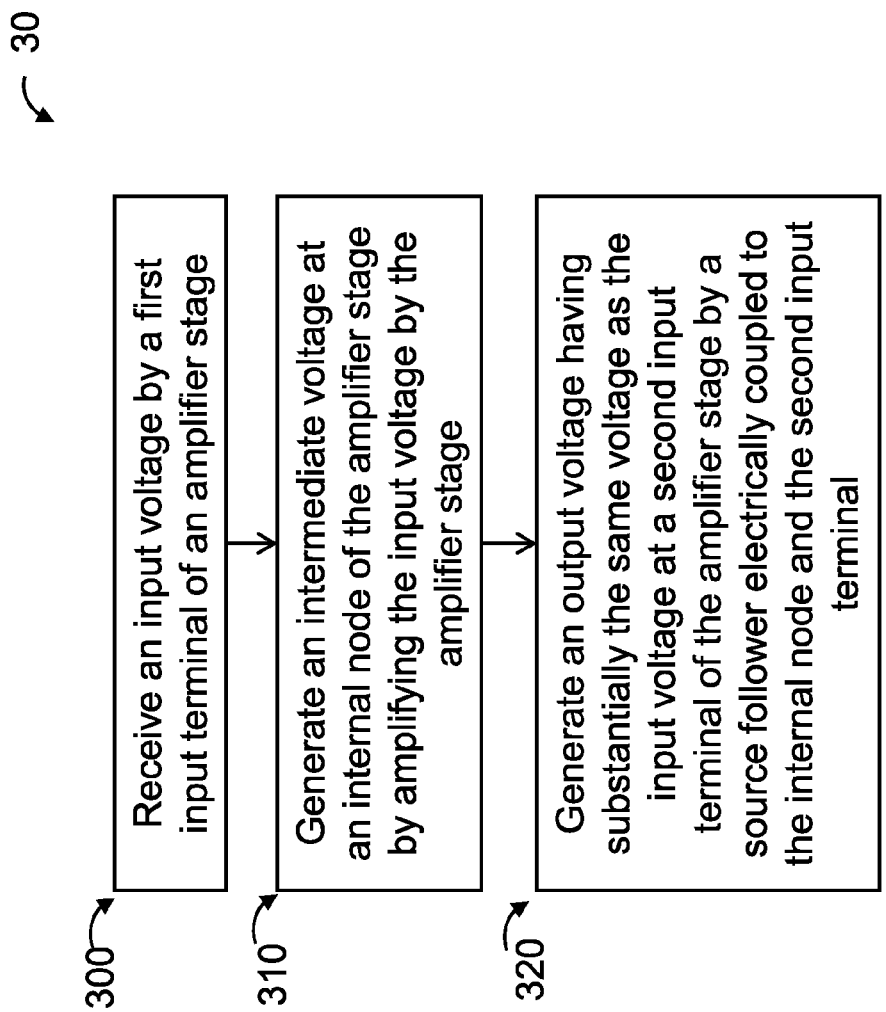
FIG. 3 is a flowchart diagram of a process for operating a device in accordance with one or more embodiments of the present disclosure.

FIG. 3 is a flowchart diagram of a method 30 of operating a device (e.g., the device 10) in accordance with one or more embodiments of the present disclosure. Reference to the FIGS. 1 and 2 is made for illustrative purposes, but the method 30 should not be construed as limited to the devices 10, 20.

An amplifier stage (e.g., the transistors 100-104) receives 300 an input voltage (e.g., the voltage VIN) at a first input terminal (e.g., the input terminal 120) of the amplifier stage. In some embodiments, the input voltage is in a range of about 40 millivolts to 200 millivolts. In some embodiments, the amplifier stage includes a differential pair (e.g., the transistors 103, 104) and an active load (e.g., the transistors 101, 102). In some embodiments, transistors of the differential pair are PMOS transistors, and transistors of the active load are NMOS transistors. In some embodiments, the amplifier stage further includes a current source (e.g., the transistor 100). In some embodiments, the input voltage is received 300 at a gate electrode of a first transistor (e.g., the transistor 103) of the differential pair.

An intermediate voltage (e.g., voltage at the node 11) is generated 310 at an internal node (e.g., the node 11) of the amplifier stage by amplifying the input voltage by the amplifier stage. In some embodiments, decreasing the input voltage increases the intermediate voltage, and increasing the input voltage decreases the intermediate voltage. In some embodiments, the internal node is a drain electrode of the first transistor of the differential pair.

An output voltage is generated 320 at a second input terminal of the amplifier stage. In some embodiments, the second input terminal is a gate electrode of a second transistor (e.g., the transistor 104) of the differential pair. In some embodiments, the output voltage is substantially the same as the input voltage. For example, the output voltage is optionally within about 10% above or below the input voltage. The output voltage is generated at least by a source follower (e.g., the transistor 106) electrically coupled to the internal node and the second input terminal. In some embodiments, a gate electrode of the source follower is electrically coupled to the internal node, and a drain electrode of the source follower is electrically coupled to the second input terminal. In some embodiments, the source follower is an NMOS transistor. In some embodiments, the output voltage is generated 320 by the source follower amplifying the intermediate voltage. In some embodiments, an increase in the intermediate voltage decreases the output voltage, and a decrease in the intermediate voltage increases the output voltage.

In some embodiments, the method 30 further includes maintaining a first voltage difference across the first transistor (e.g., the voltage Vsg_103) that is substantially the same as the sum of a second voltage difference across a third transistor (e.g., the transistor 105) and a third voltage difference across a resistor (e.g., the resistor 107). The transistor 106 provides a negative feedback loop to make voltage VOUT track voltage VIN.

Figure 4:
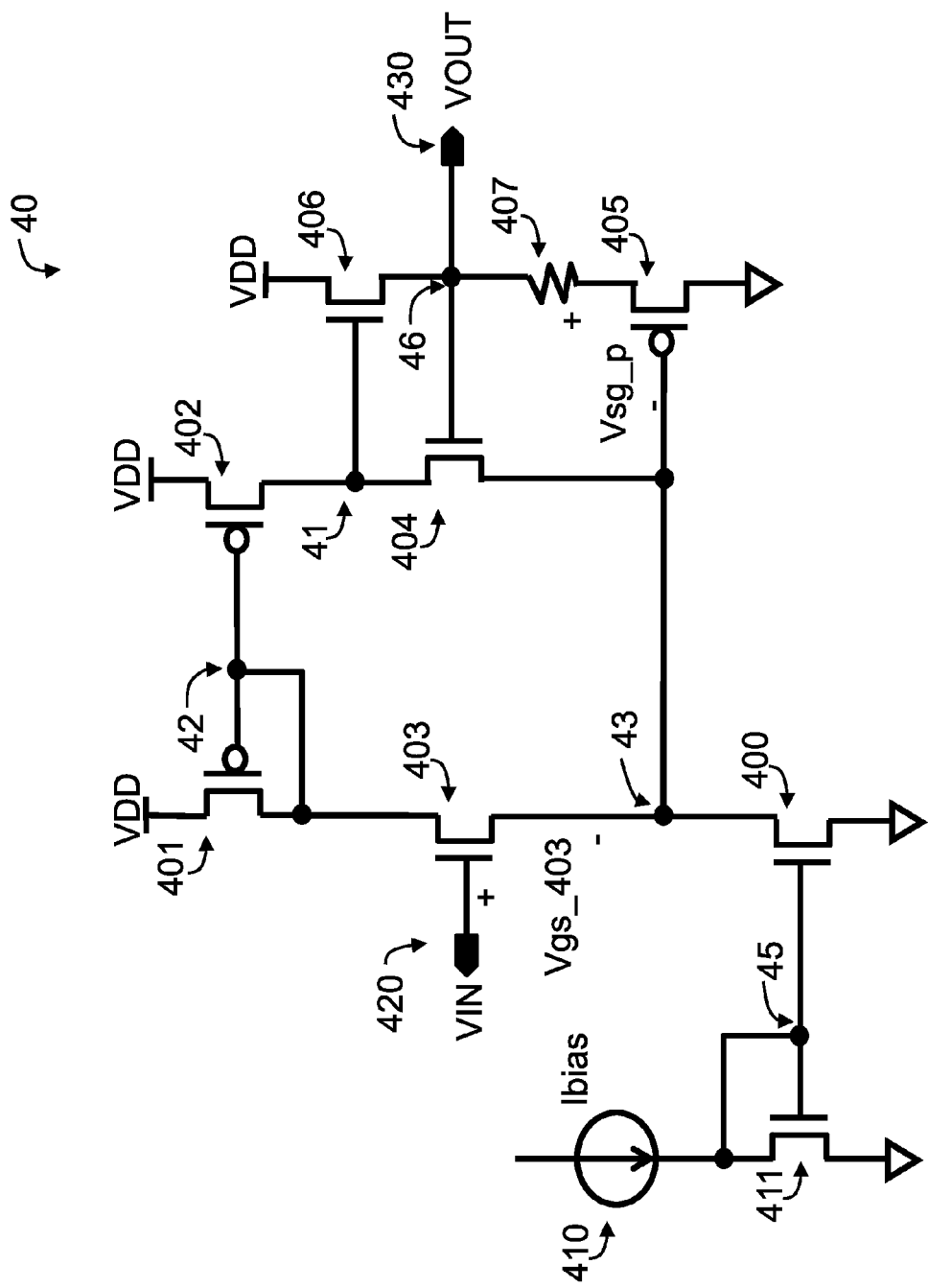
FIG. 4 is a diagram of a device in accordance with one or more embodiments of the present disclosure.

FIG. 4 is a diagram of a device 40 in accordance with one or more embodiments of the present disclosure. A gate electrode of a transistor 403 is electrically coupled to an input terminal 420. In some embodiments, the transistor 403 is an NMOS transistor. A gate electrode of a transistor 404 is electrically coupled to an output terminal 430. In some embodiments, the transistor 404 is an NMOS transistor. In some embodiments, the combination of the transistors 403, 404 is a differential pair of the device 40. A source electrode of the transistor 403 is electrically coupled to a source electrode of the transistor 404 (e.g., at a node 43). A gate-source voltage Vgs_403 is a voltage difference between the gate electrode of the transistor 403 and the source electrode of the transistor 403.

A drain electrode of the transistor 403 is electrically coupled to a drain electrode of a transistor 401. In some embodiments, the transistor 401 is a PMOS transistor. A gate electrode of the transistor 401 is electrically coupled to a gate electrode of a transistor 402. A drain electrode of the transistor 401 is electrically coupled to the gate electrode of the transistor 401. In some embodiments, the combination of the transistors 401, 402 is an active load of the differential pair (the transistors 403, 404).

A drain electrode of a transistor 400 is electrically coupled to the source electrode of the transistor 403 and the source electrode of the transistor 404. A source electrode of the transistor 400 is electrically coupled to a second voltage source. In some embodiments, the second voltage source is ground. In some embodiments, the transistor 400 is an NMOS transistor. In some embodiments, the transistor 400 is a tail current source of the differential pair (the transistor 403, 404). In some embodiments, the combination of the transistors 400-404 is an operational amplifier, an operational amplifier first stage, or the like.

In some embodiments, amplitude of current generated by the transistor 400 is based on voltage at a gate electrode of the transistor 400. The gate electrode of the transistor 400 is electrically coupled to a gate electrode of a transistor 411. The gate electrode of the transistor 400 and the gate electrode of the transistor 411 are electrically coupled to a drain electrode of the transistor 411. In some embodiments, the source electrode of the transistor 411 is electrically coupled to the second voltage source (e.g., ground). The drain electrode of the transistor 411 is electrically coupled to a reference current source 410. The reference current source 410 provides a substantially fixed electrical current Ibias. The amplitude of the current generated by the transistor 400 is substantially a multiple of the electrical current Ibias. The multiple is primarily based on a ratio of sizes of the transistor 400 and the transistor 411. As a non-limiting example, the transistor 400 optionally has a width of 5 microns and a length of 1 micron, and the transistor 411 optionally has a width of 1 micron and a length of 1 micron. In this non-limiting example, the multiple is 5 ([5/1]/[1/1]), where the size is equal to width divided by length (W/L) of the transistor under consideration.

A gate electrode of a transistor 406 is electrically coupled to the drain electrode of the transistor 402 and the drain electrode of the transistor 404. A source electrode of the transistor 406 is electrically coupled to the output terminal 430. A drain electrode of the transistor 406 is electrically coupled to a first voltage source. In some embodiments, the first voltage source is a bandgap voltage reference. The first voltage source provides a first voltage VDD for application to various terminals of the device 40 (e.g., the source electrodes of the transistors 401, 402). In some embodiments, the transistor 406 is an NMOS transistor.

A first terminal of a resistive device (or "resistor") 407 is electrically coupled to the output terminal 430. A second terminal of the resistor 407 is electrically coupled to a source electrode of a transistor 405. In some embodiments, the resistor 407 is a polysilicon resistor, or other integrated resistor. A gate electrode of the transistor 405 is electrically coupled to the source electrode of the transistor 403 and the source electrode of the transistor 404. A drain electrode of the transistor 405 is electrically coupled to the first voltage source. A source-gate voltage Vsg_405 is a voltage difference between the source electrode of the transistor 405 and the gate electrode of the transistor 405. In some embodiments, the transistor 405 is a PMOS transistor. In some embodiments, the combination of the transistors 405, 406 and the resistor 407 is a modified source follower circuit.

In some embodiments, gate-aspect ratio of the transistor 405 is greater than gate-aspect ratio of the transistor 403. When the gate-aspect ratio of the transistor 405 is greater than the gate-aspect ratio of the transistor 403, the source-gate voltage Vgs_403 is substantially equal to the sum of the gate-source voltage Vsg_405 and the voltage across the resistor 407 (e.g., $I_{407} \times R_{407}$, where $I_{407}$ is current flowing through the resistor 407, and $R_{407}$ is resistance of the resistor 407), and voltage VOUT at the output terminal 430 is substantially equal to voltage VIN at the input terminal 420. The resistor 407 self-regulates the current $I_{407}$ to satisfy the relationship just described (Vgs_403=Vsg_405+$I_{407}R_{407}$). In some embodiments, the transistor 406 operates in the linear region. In some embodiments, gate-aspect ratio of the transistor 406 is greater than gate-aspect ratio of the transistor 401.

Embodiments may achieve advantages. The transistors 106, 105 (or 406, 405), and the resistor 107 (or 407) provide substantial area and power savings of the devices 10, 20 (or 40), for example in an integrated circuit layout. The devices 10, 20, 40 are also able to provide substantially unity gain for application to a broad range of electronic circuits, including, but not limited to, generating reference voltages for sense amplifiers in embedded memory.

In accordance with one or more embodiments of the present disclosure, a device includes an amplifier stage, a source follower, a resistive device, and a transistor. The source follower has an input terminal electrically coupled to an internal node of the amplifier stage, and an output terminal electrically coupled to an input terminal of the amplifier stage and an output terminal of the device. The resistive device has a first terminal electrically coupled to the output terminal of the device. The transistor is electrically coupled to a second terminal of the resistive device and the amplifier stage.

In accordance with one or more embodiments of the present disclosure, a device comprises a first transistor, a second transistor, a third transistor, a fourth transistor, a fifth transistor, a sixth transistor, and a resistive device. The second transistor has a source electrode electrically coupled to a source electrode of the first transistor. The third transistor has a drain electrode electrically coupled to a drain electrode of the first transistor. The fourth transistor has a gate electrode electrically coupled to a gate electrode of the third transistor, and a drain electrode electrically coupled to a drain electrode of the second transistor and the gate electrode of the fourth transistor. The fifth transistor has a gate electrode electrically coupled to the drain electrode of the first transistor, and a drain electrode electrically coupled to a gate electrode of the second transistor. The sixth transistor has a gate electrode electrically coupled to the source electrode of the first transistor. The resistive device has a first terminal electrically coupled to a source electrode of the sixth transistor, and a second terminal electrically coupled to the gate electrode of the second transistor.

In accordance with one or more embodiments of the present disclosure, a method comprises receiving an input voltage by a first input terminal of an amplifier stage, generating an intermediate voltage at an internal node of the amplifier stage by amplifying the input voltage by the amplifier stage, and generating an output voltage having substantially the same voltage as the input voltage at a second input terminal of the amplifier stage by a source follower electrically coupled to the internal node and the second input terminal.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Moreover, the term "between" as used in this application is generally inclusive (e.g., "between A and B" includes inner edges of A and B).

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
    an amplifier stage comprising a differential pair, the differential pair having a common node;
    a source follower having an input terminal and an output terminal, the output terminal of the source follower coupled to an input terminal of the amplifier stage and an output terminal of the device, the input terminal of the source follower coupled to the common node of the differential pair;
    a resistive device having a first terminal electrically coupled to the output terminal of the device; and
    a transistor electrically coupled to a second terminal of the resistive device and the amplifier stage; and
    wherein the device is configured, when powered, to have a first voltage at the input terminal of the source follower and a second voltage at the common node of the differential pair, the first voltage and the second voltage comprising a same voltage.

2. The device of claim 1, wherein the amplifier stage includes:
    a current source electrically coupled to the differential pair; and
    an active load electrically coupled to the differential pair.

3. The device of claim 2, wherein:
    the input terminal of the source follower is electrically coupled to a drain electrode of a first transistor of the differential pair.

4. The device of claim 2, wherein the differential pair includes:
    a first P-type metal-oxide-semiconductor (PMOS) transistor having:
        a source electrode electrically coupled to the current source; and
        a drain electrode electrically coupled to the active load; and
    a second PMOS transistor having:
        a source electrode electrically coupled to the current source;
        a drain electrode electrically coupled to the active load; and
        a gate electrode electrically coupled to the output terminal of the source follower.

5. The device of claim 2, wherein the active load includes:
    a first N-type metal-oxide-semiconductor (NMOS) transistor having:
        a drain electrode electrically coupled to the differential pair; and
    a second NMOS transistor having:
        a drain electrode electrically coupled to the differential pair; and
        a gate electrode electrically coupled to a gate electrode of the first NMOS transistor and the drain electrode of the second NMOS transistor.

6. The device of claim 5, wherein gate-aspect ratio of the source follower is greater than gate-aspect ratio of the first NMOS transistor.

7. The device of claim 1, wherein the source follower is sized to operate in a linear region.

8. A device comprising:
    a first transistor;
    a second transistor having:
        a source electrode electrically coupled to a source electrode of the first transistor;
    a third transistor having:
        a drain electrode electrically coupled to a drain electrode of the first transistor;
    a fourth transistor having:
        a gate electrode electrically coupled to a gate electrode of the third transistor; and
        a drain electrode electrically coupled to a drain electrode of the second transistor and the gate electrode of the fourth transistor;
    a fifth transistor having:
        a gate electrode electrically coupled to the drain electrode of the first transistor; and
        a drain electrode electrically coupled to a gate electrode of the second transistor;
    a sixth transistor having:
        a gate electrode electrically coupled to the source electrode of the first transistor; and
    a resistive device having:
        a first terminal electrically coupled to a source electrode of the sixth transistor; and
        a second terminal electrically coupled to the gate electrode of the second transistor; and
    wherein:
        the fifth transistor, the sixth transistor, and the resistive device comprise a source follower;
        the first transistor and the second transistor comprise a differential pair; and
        when operating, a first voltage at an input terminal of the source follower and a second voltage at a common node of the differential pair comprise a same voltage.

9. The device of claim 8, wherein gate-aspect ratio of the sixth transistor is greater than gate-aspect ratio of the third transistor.

10. The device of claim 8, wherein gate-aspect ratio of the sixth transistor is greater than gate-aspect ratio of the first transistor.

11. The device of claim 8, wherein:
    the first and second transistors are P-type transistors; and
    the third, fourth, fifth, and sixth transistors are N-type transistors.

12. The device of claim 8, further comprising:
    a second resistive device having:
        a first terminal electrically coupled to a source electrode of the fifth transistor; and
        a second terminal electrically coupled to a voltage supply node.

13. The device of claim 8, further comprising:
    a seventh transistor having:
        a drain electrode electrically coupled to the source electrode of the first transistor.

14. The device of claim 8, wherein:
    the fifth transistor is sized to operate in a linear region.

15. A method comprising:
    receiving an input voltage by a first input terminal of an amplifier stage;
    generating an intermediate voltage at a common node of a differential pair of the amplifier stage by amplifying the input voltage by the amplifier stage; and
    generating an output voltage having a substantially same voltage as the input voltage at a second input terminal of the amplifier stage by a source follower electrically coupled to the common node and the second input terminal, wherein, when generating voltages, a voltage at an input terminal of the source follower comprises a same voltage as the intermediate voltage.

16. The method of claim 15, further including:
receiving the input voltage by a gate electrode of a first transistor of the differential pair of the amplifier stage.

17. The method of claim 16, further including:
generating the intermediate voltage at a drain electrode of the first transistor.

18. The method of claim 17, further including:
generating the output voltage by a transistor electrically coupled to the amplifier stage, and a resistive device electrically coupled to the transistor and the second input terminal.

19. The method of claim 18, further including:
maintaining a first voltage difference across the first transistor that is a substantially same voltage as a sum of a second voltage difference across the transistor and a third voltage difference across the resistive device.

20. The method of claim 15, further including:
operating the source follower in a linear region.

* * * * *